(12) United States Patent
Zeng et al.

(10) Patent No.: US 8,742,740 B2
(45) Date of Patent: Jun. 3, 2014

(54) DIGITAL PEAK INPUT VOLTAGE DETECTOR FOR A POWER CONVERTER CONTROLLER

(75) Inventors: Qinggang Zeng, San Jose, CA (US); Giao Minh Pham, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 1282 days.

(21) Appl. No.: 12/234,442

(22) Filed: Sep. 19, 2008

(65) Prior Publication Data

US 2010/0073974 A1    Mar. 25, 2010

(51) Int. Cl.
*H02M 3/157* (2006.01)

(52) U.S. Cl.
USPC ............ 323/283; 363/21.05; 363/21.13

(58) Field of Classification Search
CPC ........... H02M 3/00; H02M 3/44; H02M 3/22; H02M 5/46; H02M 5/40; H02M 7/00; H02M 5/00
USPC ............ 323/283, 284, 285; 363/21.01, 21.05, 363/21.12, 21.13, 97
See application file for complete search history.

(56) References Cited

U.S. PATENT DOCUMENTS

| | | | |
|---|---|---|---|
| 5,283,582 A | | 2/1994 | Krenik |
| 6,177,787 B1* | | 1/2001 | Hobrecht ................. 323/283 |
| 6,249,876 B1* | | 6/2001 | Balakrishnan et al. ....... 713/501 |
| 6,473,280 B1* | | 10/2002 | Buxton et al. ................. 361/18 |
| 7,187,316 B1* | | 3/2007 | DeGeronimo ............... 341/155 |
| 7,292,013 B1* | | 11/2007 | Chen et al. ................... 323/222 |
| 2002/0118553 A1 | | 8/2002 | Morita |
| 2004/0080446 A1 | | 4/2004 | Chen et al. |
| 2005/0111242 A1* | | 5/2005 | Oh .............................. 363/21.07 |
| 2005/0140396 A1 | | 6/2005 | Glass |
| 2006/0043956 A1* | | 3/2006 | Clavette ...................... 323/288 |
| 2006/0197516 A1* | | 9/2006 | Chiu et al. ................... 323/282 |
| 2007/0041224 A1* | | 2/2007 | Moyse et al. ............... 363/21.01 |
| 2007/0071084 A1* | | 3/2007 | Lai et al. ..................... 375/229 |
| 2007/0085523 A1* | | 4/2007 | Scoones et al. ............. 323/314 |
| 2007/0085596 A1* | | 4/2007 | Ito .............................. 327/534 |
| 2008/0094865 A1* | | 4/2008 | So et al. ...................... 363/49 |
| 2008/0174341 A1* | | 7/2008 | Teo et al. .................... 327/57 |
| 2008/0205103 A1 | | 8/2008 | Sutardja et al. |
| 2008/0238395 A1* | | 10/2008 | Hasegawa .................... 323/283 |
| 2008/0246455 A1* | | 10/2008 | Chu et al. .................... 323/283 |
| 2008/0266907 A1* | | 10/2008 | Kim et al. ................... 363/21.1 |

FOREIGN PATENT DOCUMENTS

CN    101231890 A    7/2008

OTHER PUBLICATIONS

EP 09 17 0477—European Search Report dated Aug. 6, 2010 (3 pages).
EP 09 17 0477—European Office Action dated Oct. 1, 2010 (7 pages).

(Continued)

*Primary Examiner* — Adolf Berhane
*Assistant Examiner* — Gustavo Rosario Benitez
(74) *Attorney, Agent, or Firm* — Blakely Sokoloff Taylor & Zafman LLP

(57) ABSTRACT

An example integrated circuit controller for a power converter includes a digital peak detector and a switching block. The digital peak detector is coupled to output a digital count signal representative of a peak input voltage of the power converter. The switching block is coupled to control switching of a power switch of the power converter to regulate an output of the power converter. The switching block is further coupled to control the switching of the power switch in response to the digital count signal.

18 Claims, 9 Drawing Sheets

(56) References Cited

OTHER PUBLICATIONS

CN 200910169095.9—First Chinese Office Action with Search Report and English Translation, issued Apr. 3, 2013 (31 pages).

JP 2009-215808 Office Action with English translation mailed Nov. 12, 2013 (4 pages).
CN 200910169095.9 Office Action with English translation posted Nov. 23, 2013 (23 pages).

* cited by examiner

/ 400

| VALUE/COUNT | BIT$_1$ | BIT$_2$ | BIT$_3$ |
|---|---|---|---|
| 0 | 0 | 0 | 0 |
| 1 | 1 | 0 | 0 |
| 2 | 0 | 1 | 0 |
| 3 | 1 | 1 | 0 |
| 4 | 0 | 0 | 1 |
| 5 | 1 | 0 | 1 |
| 6 | 0 | 1 | 1 |
| 7 | 1 | 1 | 1 |

FIG. 4

DIGITAL PEAK INPUT VOLTAGE DETECTOR FOR A POWER CONVERTER CONTROLLER

BACKGROUND INFORMATION

1. Field of the Disclosure

The present invention relates generally to power converters, and more specifically, the invention relates to control circuits that detect a peak input voltage.

2. Background

Many electrical devices such as cell phones, personal digital assistants (PDA's), laptops, etc. are powered by a source of DC power. Because power is generally delivered through a wall outlet as high-voltage AC power, a device, typically referred to as a power converter, is required to transform the high-voltage AC power to usable DC power for many electrical devices. The usable DC power may be provided by the power converter directly to the device or it may be used to charge a rechargeable battery that, in turn, provides energy to the device, but which requires charging once stored energy is drained. In operation, a power converter may use a controller to regulate output power delivered to an electrical device that may be generally referred to as a load. The controller regulates the transfer of energy to the load. In one instance a controller may control a power switch to turn on and off in response to feedback information from a sensor to transfer energy pulses to the output from the high-voltage AC power source.

The high-voltage AC power source typically includes a cyclic input voltage signal. For example, the usual waveform of an AC power source is that of a sine wave. The peak value of each cycle of the input voltage signal may be used for a variety of purposes, including to control the switching of the power switch. However, the peaks of the input voltage signal may vary with time. That is, the peak input voltage may increase or decrease from cycle to cycle.

BRIEF DESCRIPTION OF THE DRAWINGS

Non-limiting and non-exhaustive embodiments and examples of the present invention are described with reference to the following figures, wherein like reference numerals refer to like parts throughout the various views unless otherwise specified.

FIG. 4 is a table illustrating example counts of the counter of FIG. 3.

DETAILED DESCRIPTION

A digital peak input voltage detect used in a power converter controller is disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

Figure 1:
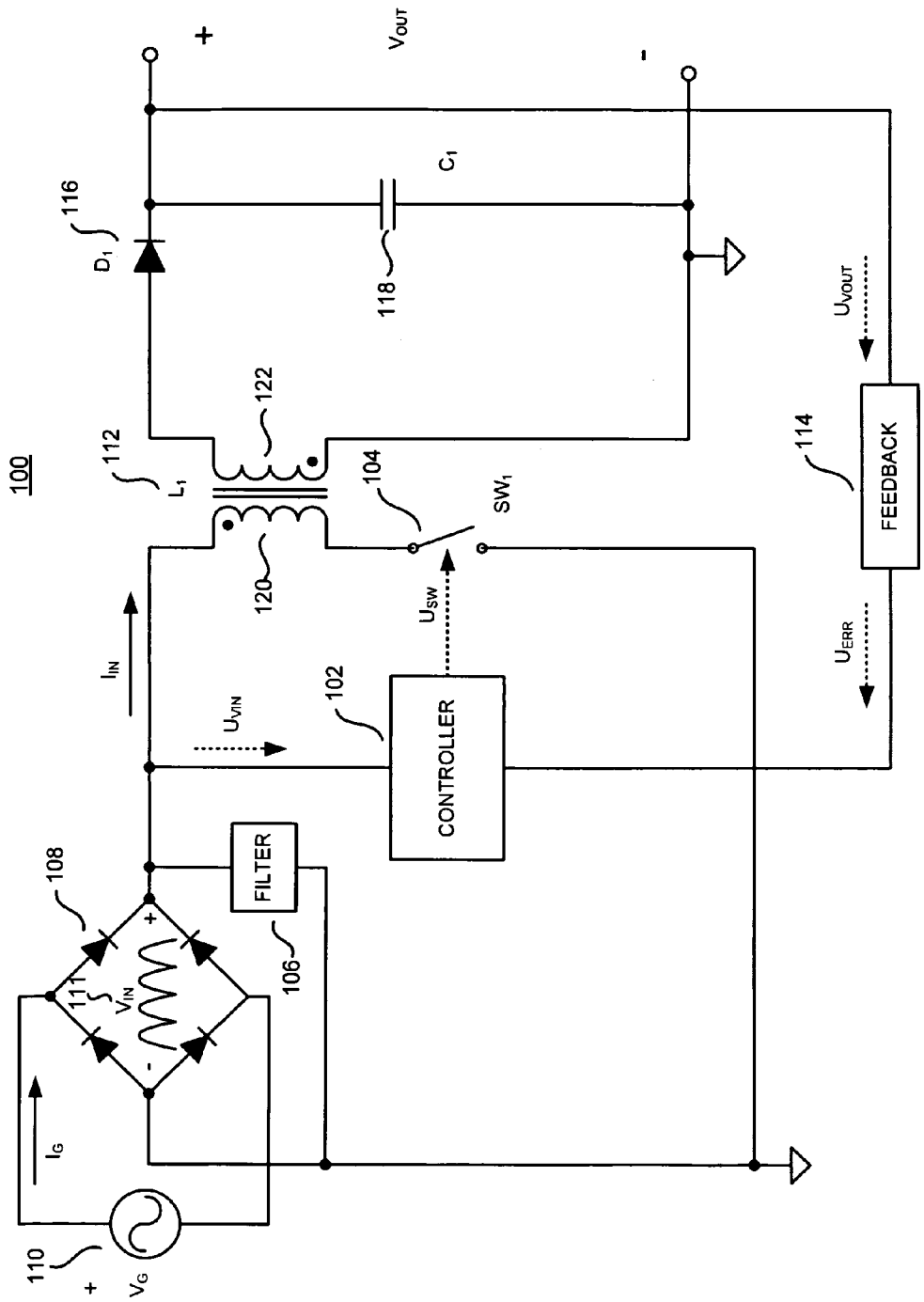
FIG. 1 is a functional block diagram illustrating one example of a switching power converter that uses a controller includes a digital peak input voltage detector in accordance with the teachings of the present invention.

FIG. 1 is a functional block diagram illustrating one example of a switching power converter 100 which uses a controller 102 including a digital peak input voltage detector in accordance with the teachings of the present invention. The illustrated example of power converter 100 includes a controller 102, a power switch 104, a filter circuit 106, a rectifier circuit 108, an energy transfer element 112, a feedback circuit 114, a diode 116 and a capacitor 118. Energy transfer element 112 is illustrated as including an input winding 120 and an output winding 122.

Power converter 100 provides output power to a load (e.g., at $V_{OUT}$ from an unregulated input voltage $V_G$ 110. Input voltage $V_G$ 110 is coupled to rectifier circuit 108 to provide a rectified input voltage $V_{IN}$ 111 to energy transfer element 112 and power switch 104. In particular, rectified input voltage $V_{IN}$ 111 is a time varying DC voltage that is representative of a portion of a sinusoidal waveform. In the example of FIG. 1, energy transfer element 112 is a transformer with input winding 120 and output winding 122. An "input winding" may also be referred to as a "primary winding" and an "output winding" may also be referred to as a "secondary winding." Power switch 104 may be closed, thereby allowing current to be conducted through the switch, and opened, thereby substantially terminating conduction through the switch in response to controller 102, which may utilize switching signal $U_{SW}$. Thus, a switch that is closed may be referred to as being in an ON state, whereas a switch that is open may be referred to as being in an OFF state. In one example, power switch 104 is a transistor. In one example, controller 102 may be implemented as a monolithic integrated circuit or may be implemented with discrete electrical components or a combination of discrete and integrated circuits. During operation of power converter 100, the switching of power switch 104 produces pulsating current in diode 116 which is filtered by capacitor 118 to produce a substantially constant output voltage $V_{OUT}$. In one example, the switching of power switch 104 produces a substantially constant output current (not shown) to a load.

The output quantity to be regulated by controller 102 switching power switch 104 could be output voltage $V_{OUT}$, an output current, or a combination of the two. Feedback circuit 114 is coupled to provide an error signal $U_{ERR}$. In one example, the feedback circuit 114 is coupled to provide an error signal $U_{ERR}$ in response to an output feedback signal $U_{VOUT}$ where the error signal $U_{ERR}$ may be representative of output voltage $V_{OUT}$.

As shown in the depicted example, controller 102 is coupled to receive an input voltage signal $U_{VIN}$. Input voltage signal $U_{VIN}$ is then used by controller 102 to digitally detect a peak input voltage of the rectified input voltage $V_{IN}$. In operation, controller 102 operates power switch 104 to substantially regulate an output quantity of power converter 100. In another example, controller 102 may also improve a power factor of power converter 100 in response to the digitally detected peak input voltage. Power factor may be defined as a quality of power measured by the ratio of the amount of usable power to the amount of total power delivered.

Figure 2:
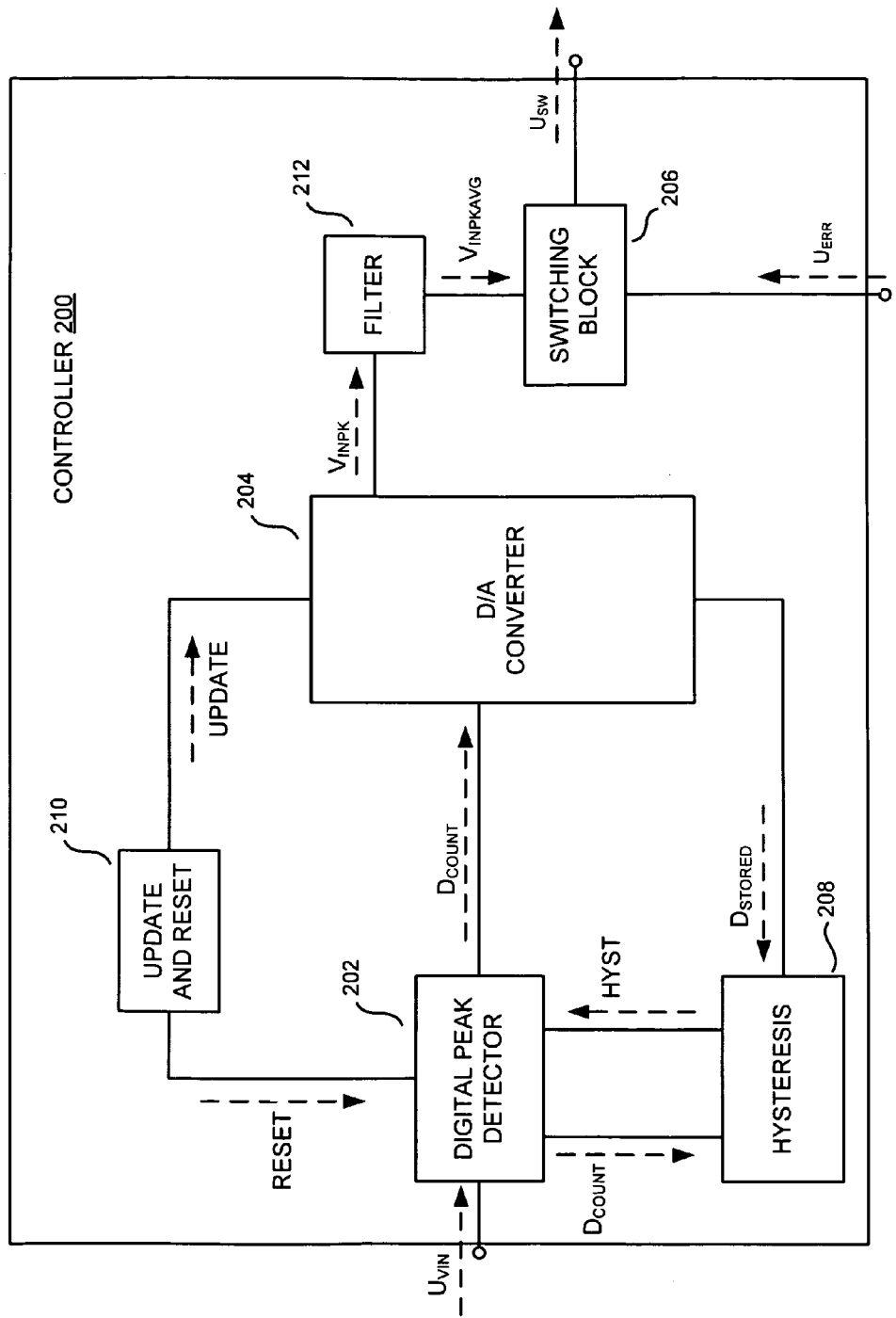
FIG. 2 is a functional block diagram illustrating an example controller including the digital peak input voltage detector which may be utilized in the converter of FIG. 1.

FIG. 2 is a functional block diagram illustrating an example controller 200 including a digital peak input voltage detector 202, which may be utilized in converter 100 of FIG. 1. The illustrated example of controller 200 further includes a digital-to-analog (D/A) converter 204, a switching block 206, a hysteresis circuit 208, update and reset circuit 210, and filter circuit 212. Controller 200 is one possible implementation of controller 102 of FIG. 1.

As shown in FIG. 2, digital peak detector 202 is coupled to receive input voltage signal $U_{VIN}$ and to output a digital count signal $D_{COUNT}$. In the illustrated example, digital peak detector 202 is coupled to output the digital count signal $D_{COUNT}$ to D/A converter 204 and to hysteresis circuit 208. Hysteresis circuit 208 is further coupled to provide a hysteresis signal HYST to digital peak detector 202. FIG. 2 further illustrates update and reset circuit 210 as coupled to provide a RESET signal to digital peak detector 202 and to provide an UPDATE signal to D/A converter 204. D/A converter 204 is coupled to provide a stored digital count signal to hysteresis circuit 208 and to provide an analog input voltage peak signal $V_{INPK}$ to filter circuit 212. Switching block 206 is coupled to receive an average peak input voltage signal $V_{INPKAVG}$ from filter circuit 212 and further coupled to receive error signal $U_{ERR}$. Lastly, switching block 206 is coupled to output switching signal $U_{SW}$.

In operation of controller 200, digital peak detector 202 receives the RESET signal from the update and reset circuit 210 and in response, clears any previous values which may have been detected. Digital peak detector 202 detects the peak input voltage of input voltage signal $U_{VIN}$. In one example, input voltage signal $U_{VIN}$ is a rectified AC voltage signal. Digital peak detector 202 then generates digital count signal $D_{COUNT}$ that is representative of the detected peak input voltage. In one example digital count signal $D_{COUNT}$ is a binary signal. Digital count signal $D_{COUNT}$ may be serially output from digital peak detector 202. That is, Digital peak detector 202 may output digital count signal $D_{COUNT}$ one bit at a time, sequentially, over a communications channel or data bus. In another example, digital count signal $D_{COUNT}$ may be output from digital peak detector 202 in parallel. That is, several bits of digital count signal $D_{COUNT}$ may be output simultaneously from digital peak detector 202 over a data bus.

Upon receiving the UPDATE signal, D/A converter 204 stores digital count signal $D_{COUNT}$ into internal storage (not shown). In one example, D/A converter 204 stores the digital count signal $D_{COUNT}$ until it receives another UPDATE signal from update and reset circuit 210. In one example, D/A converter 204 stores the digital count signal $D_{COUNT}$ at least until the next cycle of input voltage signal $U_{VIN}$. Next, D/A converter 204 converts the stored digital count signal into an analog input voltage peak signal $V_{INPK}$. D/A converter 204 also outputs a stored digital count signal $D_{STORED}$ to hysteresis circuit 208. In one embodiment, the stored digital count signal $D_{STORED}$ may be the previously received value of $D_{COUNT}$. As with the digital count signal $D_{COUNT}$, the stored digital count signal $D_{STORED}$ may be communicated serially or in parallel.

Upon receiving the analog input voltage peak signal $V_{INPK}$, filter circuit 212 averages one or more consecutive analog input voltage peak signals and outputs an average analog input voltage peak signal $V_{INPKAVG}$. Thus, the average analog input voltage peak signal $V_{INPKAVG}$ may represent a continuously averaging value of one or more peak input voltages over one or more cycles of the peak values of input voltage signal $U_{VIN}$.

Switching block 206 may then output switching signal $U_{SW}$ in response to the average analog input voltage peak signal $V_{INPKAVG}$ and also in response to the error signal $U_{ERR}$. In one example, switching block 206 adjusts a duty factor of the switching signal $U_{SW}$ in response to the error signal $U_{ERR}$ in order to regulate an output of a power converter. In one example, switching block 206 may scale the error signal $U_{ERR}$ in response to average peak input voltage signal $V_{INPKAVG}$ input. In other words, the average peak input voltage signal $V_{INPKAVG}$ may set the dynamic range of error signal $U_{ERR}$.

FIG. 2 further illustrates hysteresis circuit 208 coupled between D/A converter 204 and digital peak detector 202. In operation, hysteresis circuit 208 compares a previously stored digital count of the D/A converter 204 with the current count of the digital peak detector. If the current digital count is equal to the stored digital count (in some examples, the previously stored count), hysteresis circuit 208 may generate a hysteresis signal HYST to improve the stability of digital peak detector 202. For example, if the stored digital count signal $D_{STORED}$ is equal to digital count signal $D_{COUNT}$, then hysteresis circuit may generate hysteresis signal HYST to adjust the analog-to-digital conversion of the peak input voltage.

Figure 3:
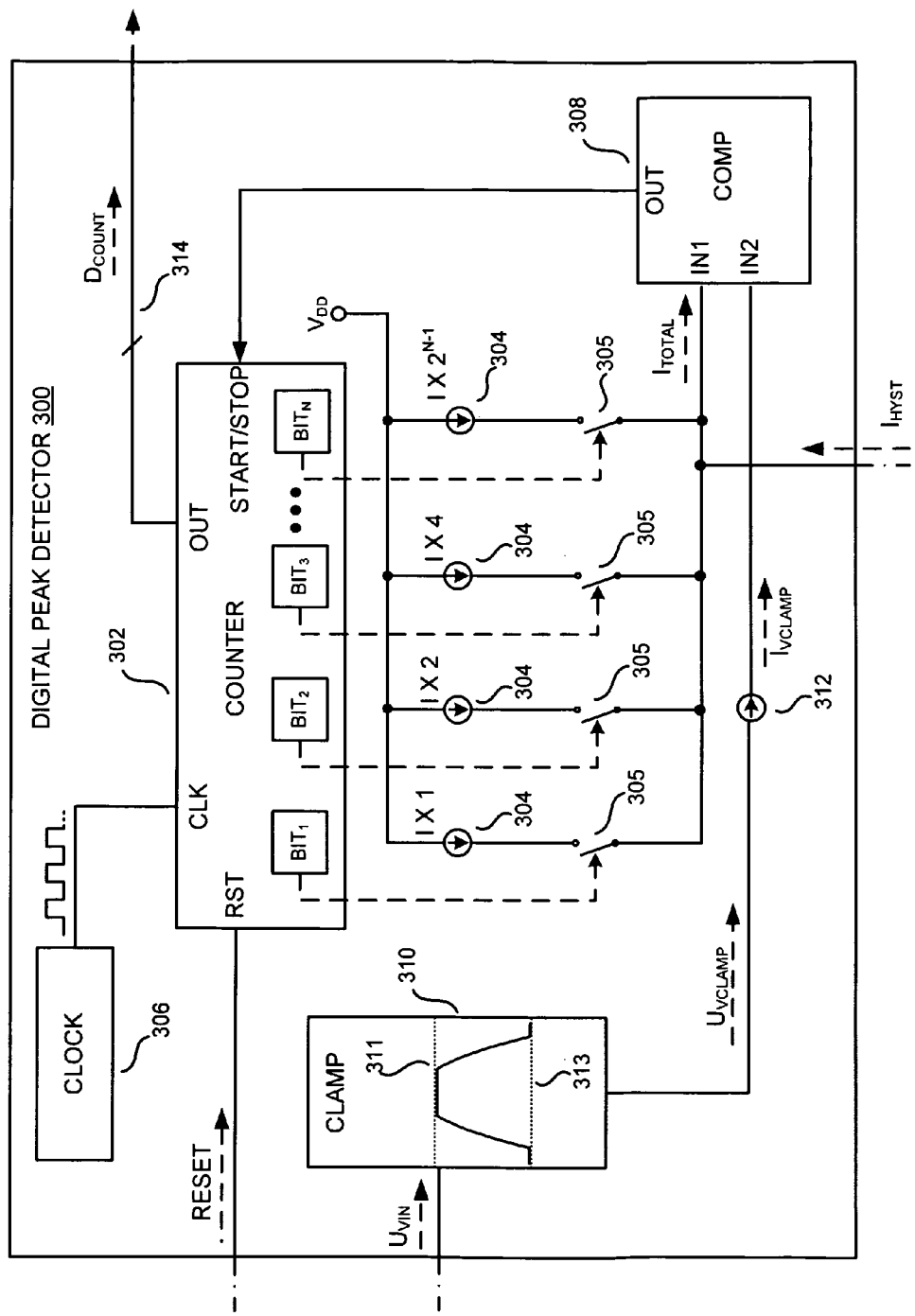
FIG. 3 is a functional block diagram illustrating an example digital peak input voltage detector in accordance with the teachings of the present invention.

FIG. 3 is a functional block diagram illustrating an example digital peak input voltage detector 300 in accordance with the teachings of the present invention. The illustrated example of digital peak detector 300 includes a counter 302, current sources 304, switches 305, a clock source 306, a comparator 308, a clamp circuit 310, a current source 312, and a communications link 314. Digital peak detector 300 is one possible implementation of digital peak detector 202 of FIG. 2.

In the illustrated example of FIG. 3, counter 302 is a binary counter that increments in response to a clock signal received from clock source 306 at a clock input CLK of the counter 302. In one example, $BIT_1$ is the least significant bit (LSB) and $BIT_N$ is the most significant bit (MSB). In one example, counter 302 is a plurality of flip-flops (not shown) arranged to form either an asynchronous counter or a synchronous counter. In operation, counter 302, when enabled, may increment the count with each pulse of the clock signal received at clock input CLK.

FIG. 4 is a table 400 illustrating example counts of the counter 302. For example, at the first pulse of the clock signal, the count of counter 302 is 1, which may be represented by $BIT_1$ being a logic high, while all other bits are a logic low. A counter count of 6 would correspond with $BIT_1$ being a logic low, while $BIT_2$ and $BIT_3$ are a logic high. Although FIGS. 3 and 4 illustrate counter 302 as a 3-bit counter, it should be appreciated any number of bits may be included in counter 302 depending on the resolution needed for determining the peak input voltage.

Referring back to FIG. 3, counter 302 further includes a reset input RST for receiving the RESET signal from the update and reset circuit 210. Upon receiving the RESET signal, counter 302 resets the count of the counter 302. For example, counter 302 may set each of the $BITS_{1-N}$ to a logic low in response to the RESET signal. Counter 302 also includes a START/STOP input for receiving the output of comparator 308. Counter 302 may start and stop incrementing the count of the counter 302 in response to the signal received at the START/STOP input. That is, the START/STOP input may provide an enable function responsive to the output of comparator 308. For example, comparator 308 may output a logic low signal to the START/STOP input of counter 302, which may indicate that counter 302 is to increment the count with each cycle of the clock signal. Continuing with this example, comparator 308 may output a logic high signal to the START/STOP input of counter 302, which may indicate that counter 302 is to stop incrementing the count (i.e., ignore the clock signal). In one example, START/STOP input may gate the CLK input to the other internal circuitry of counter 302.

FIG. 3 further illustrates a plurality of current sources 304 coupled together by way of switches 305 to provide a total current signal $I_{TOTAL}$ having a current value that is responsive to the count of counter 302. In the illustrated example, the value of the current provided by each current source 304 is binarily weighted depending on the bit of counter 302 with which it is associated. For example, $BIT_1$ may be coupled to enable/disable a current source 304 to provide a current of I while $BIT_2$ may be coupled to enable/disable a current source to provide a current of Ix2, etc. In one example, a logic high value (1) for any of the counter bits $BIT_{1-N}$ would correspond to a closed (or in other words, enabled) switch 304. In another example, a logic low value (0) for any of the counter bits $BIT_{1-N}$ may correspond to a closed (or in other words, enabled) switch 304. The currents provided by each current source 304 when enabled are summed to output the total current signal $I_{TOTAL}$ to IN1 input of comparator 308.

The IN2 input of comparator 308 is illustrated in FIG. 3 as receiving a current signal $I_{VCLAMP}$, which, in one example is a current representative of at least a portion of the input voltage signal $U_{VIN}$. In one example, digital peak detector 300 includes current source 312 to convert a clamped input voltage signal $U_{VCLAMP}$ into the current signal $I_{VCLAMP}$. In operation, comparator 308 compares the total current signal $I_{TOTAL}$ with the current signal $I_{VCLAMP}$. In one embodiment, if the total current signal $I_{TOTAL}$ is greater than the current signal $I_{VCLAMP}$, then the output of comparator 308 sends a signal to the START/STOP input of the counter 302 to stop the counting of counter 302. If the current signal $I_{VCLAMP}$ subsequently increases to greater than the value of the total current signal $I_{TOTAL}$, then the output of comparator 308 will allow the counting of counter 302 to continue from where it left off.

Figure 5:
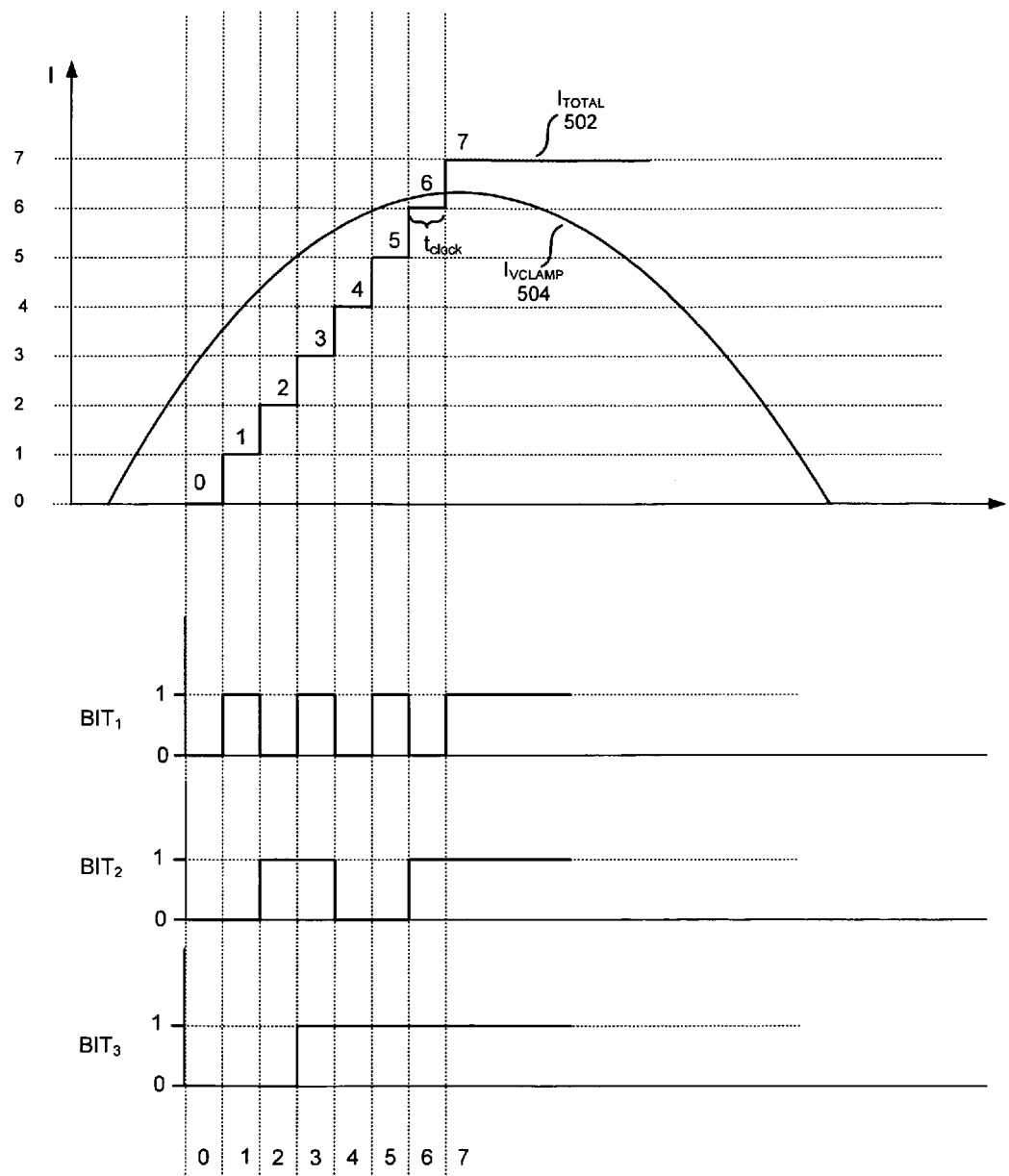
FIG. 5 shows example waveforms at the input of the comparator of FIG. 3 and for the counter of FIG. 3.

FIG. 5 shows example waveforms at the input of the comparator 308 and of $BITS_{1-3}$ of counter 302. The waveforms of FIG. 5 are described with reference to FIGS. 3 and 5. Waveform 502 is one possible representation of the total current signal $I_{TOTAL}$ received at input IN1 of comparator 308. Waveform 504 is one possible representation of the current signal $I_{VCLAMP}$ received at input IN2 of comparator 308. As shown in FIG. 5, the count of counter 302 is incremented as indicated by $BITS_{1-3}$ changing logic levels. As the count increases the corresponding current sources 304 are enabled and disabled, resulting in the total current signal $I_{TOTAL}$ having the discrete waveform 502. As shown in example of FIG. 5, during the transition from count 6 to count 7, the total current signal (e.g., waveform 502) increases to greater than the current signal (e.g., waveform 504). Thus, at this point comparator 308 will be triggered causing counter 302 to stop counting. As stated previously, if the current signal $I_{VCLAMP}$ increases again, counter 302 will be allowed to continue with its count. It is in this manner that the final count of counter 302 may be taken as the digital representation of the peak input voltage of the power converter.

Referring now only to FIG. 3, the count of counter 302 may be output as digital count signal $D_{COUNT}$ on communications link 314. In one example, communications link 314 is a bus that includes a plurality of lines for transmitting the count (e.g., $BITS_{1-N}$) in parallel. In another example, counter 302 outputs the count serially on one or more lines of communications link 314.

FIG. 3 further illustrates digital peak detector 300 as receiving the input voltage signal $U_{VIN}$ at clamp circuit 310. As mentioned previously, input voltage signal $U_{VIN}$ may be a rectified AC input voltage. Clamp circuit 310 may be configured to clamp the rectified AC input voltage between a high threshold 311 and/or a low threshold 313. In one example, clamp circuit 310 clamps the rectified AC input voltage to high threshold 311 to keep the current signal $I_{VCLAMP}$ within a range of counter 302. For example, if a peak value of the rectified AC input voltage causes the current signal $I_{VCLAMP}$ to be greater than a maximum value of the total current signal $I_{TOTAL}$, then counter 302 will exhaust its count before a peak is detected. Thus, clamp circuit 310 may be included in digital peak detector 300 to output a clamped input voltage signal $U_{VCLAMP}$ that is within the operating range of counter 302.

In one example, clamp circuit 310 clamps the rectified AC input voltage to the low threshold 313. Clamping the rectified AC input voltage may improve the accuracy of digital peak detector 300. For example, rather than compare the current signal $I_{VCLAMP}$ starting at a current of zero, it may be assumed that the input voltage signal $U_{VIN}$ has a minimum value. Thus, a lower portion of the input voltage signal $U_{VIN}$ may be clamped and the resulting current signal $I_{VCLAMP}$ may be then compared with the total current signal $I_{TOTAL}$. Clamping the rectified AC input voltage to low threshold 313 may increase the resolution of digital peak detector 300 by using $BITS_{1-N}$ to measure only a portion of the full waveform rather than an entire unclamped waveform.

FIG. 3 also illustrates the hysteresis signal HYST as being received at the IN1 input of comparator 308. In one example, hysteresis signal HYST is a current that is added to the total current signal $I_{TOTAL}$ by hsyteresis circuit 208 (see FIG. 2) when the count of counter 302 is equal to a count of the previous cycle of the input voltage signal $U_{VIN}$ (e.g., $D_{COUNT}=D_{STORED}$). Thus, in situations where the input voltage signal $U_{VIN}$ includes consecutive peak voltages which are close in value, adding the hysteresis signal HYST to the total current signal $I_{TOTAL}$ may help reduce the occurrence of the analog input voltage peak signal $V_{INPK}$ from oscillating between two different values.

Figure 6:
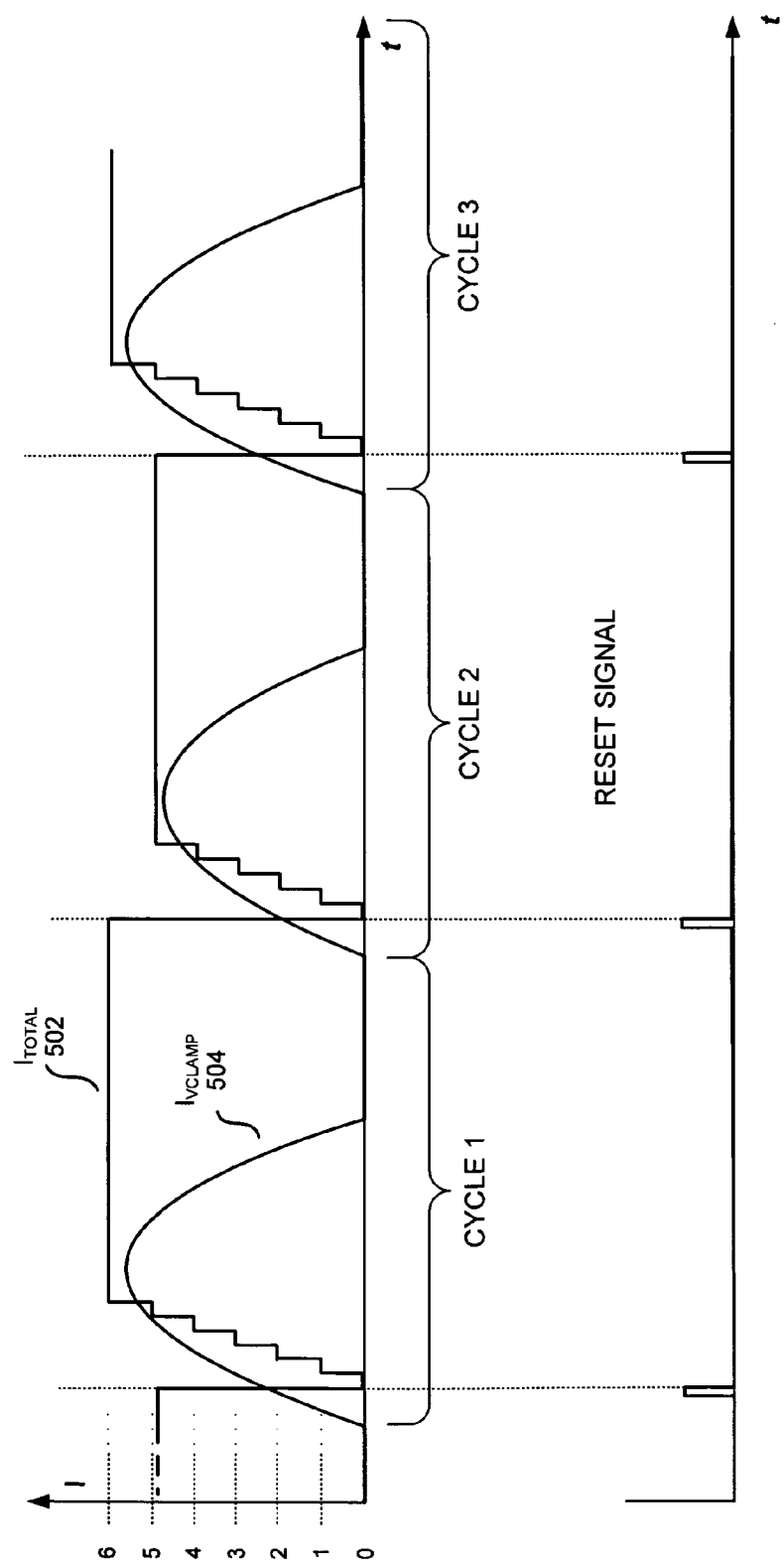
FIG. 6 shows example waveforms at the input of the comparator of FIG. 3 and of the update and reset circuit of FIG. 2.

FIG. 6 shows example waveforms at the input of the comparator 308 and at the reset RST input of counter 302. The waveforms of FIG. 6 are described with reference to FIGS. 3 and 6. Waveform 502 is one possible representation of the total current signal $I_{TOTAL}$ received at input IN 1 of comparator 308. Waveform 504 is one possible representation of the current signal $I_{VCLAMP}$ received at input IN2 of comparator 308. As shown in FIG. 6, current signal $I_{VCLAMP}$ is representative of a rectified and clamped AC input voltage signal.

Current signal $I_{VCLAMP}$ is further shown as including a plurality of cycles (e.g., cycle 1, 2 and 3). As is shown in FIG. 6, the count of counter 302 is reset in response to the RESET signal. More specifically the RESET signal may be asserted in response to the input voltage $V_{IN}$ reaching a threshold input voltage value. For example, since input voltage $V_{IN}$ is periodic, a certain input voltage threshold value may cause RESET to be asserted such that the counter 302 is reset during each cycle. In another example, RESET signal may be timed, such that the RESET signal will reset counter 302 during each input voltage cycle. In another example, RESET signal may be asserted in response to a duty factor threshold. More specifically, duty factor is defined as the ratio of time power switch 104 is in the ON state over a set period of time. For example, when the duty cycle (calculated by switching block 206) exceeds a certain threshold the reset signal is asserted. The RESET signal is configured to be output to counter 302 at least once during each cycle of the rectified input voltage $V_{IN}$ and will be asserted before the peak of that particular input voltage cycle.

Figure 7:
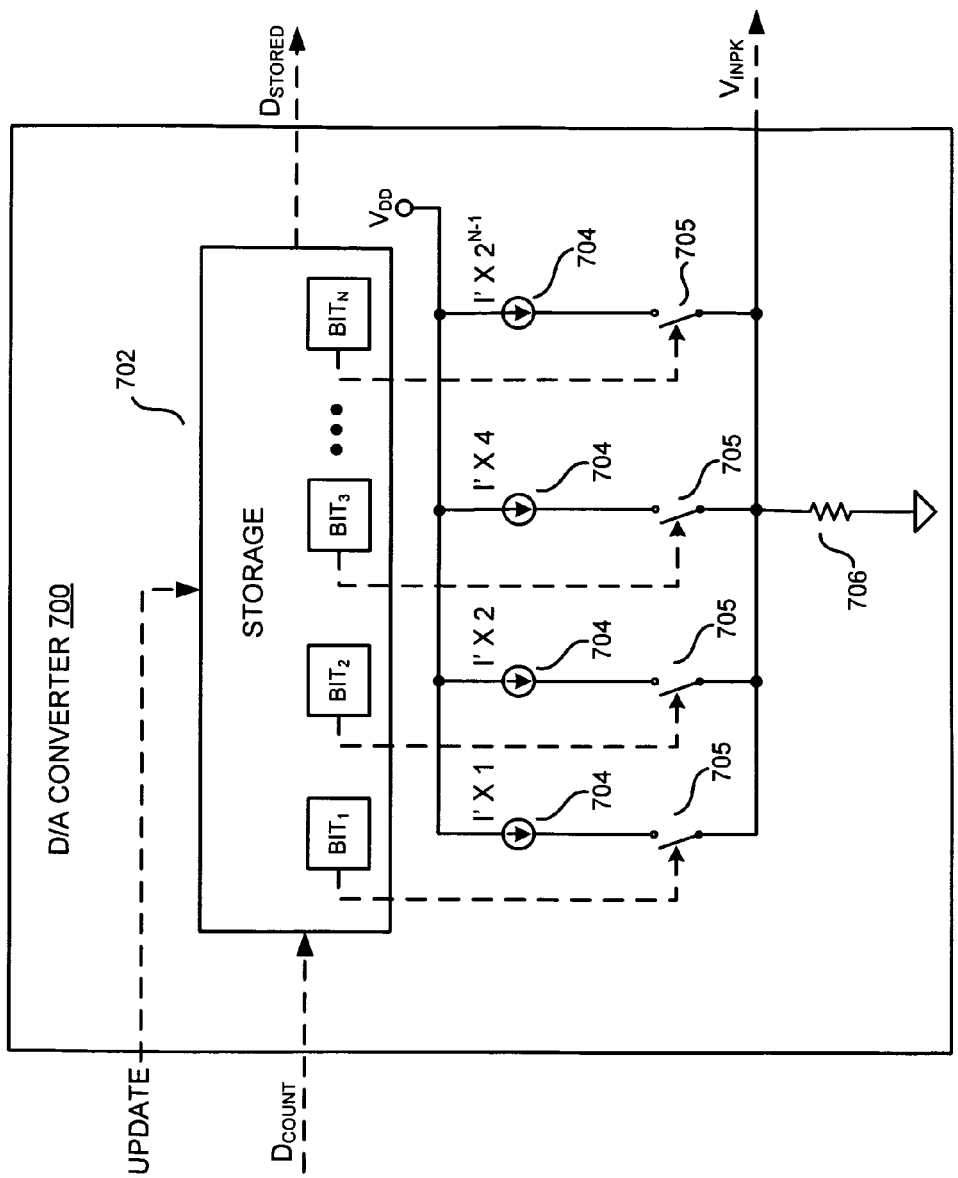
FIG. 7 is a functional block diagram illustrating an example digital-to-analog (D/A) converter which may be utilized in the controller of FIG. 2.

FIG. 7 is a functional block diagram illustrating an example digital-to-analog (D/A) converter 700, in accordance with the teachings of the present invention. The illustrated example of D/A converter 700 includes internal storage 702, current sources 704, switches 705 and a resistor 706. D/A converter 700 is one possible implementation of D/A converter 204 of FIG. 2.

In the illustrated example of FIG. 7, internal storage 702 is configured to store the digital count signal $D_{COUNT}$. By way of example, internal storage 702 is a plurality of latches, each configured to store at least one of $BITS_{1-N}$. In one example, internal storage 702 stores the digital count signal $D_{COUNT}$ at least until a next cycle of the input voltage signal $U_{VIN}$.

D/A Converter 700 further includes an input for receiving the UPDATE signal. Upon receiving the UPDATE signal, D/A converter 700 replaces any count currently stored in internal storage 702 with the digital count signal $D_{COUNT}$. For example, internal storage 702 may have stored in it a count from a previous cycle of the input voltage signal $U_{VIN}$. Upon receiving the UPDATE signal, internal storage 702 resets each of the $BITS_{1-N}$ corresponding to the bits contained in the digital count signal $D_{COUNT}$.

FIG. 7 further illustrates a plurality of current sources 704 coupled together by way of switches 705 to provide analog input voltage peak signal by way of resistor 706. In the illustrated example, the value of the current provided by each current source 704 is binarly weighted depending on the bit of internal storage 702 with which it is associated. For example, $BIT_1$ may be coupled to enable/disable a current source 704 to provide a current of I' while $BIT_2$ may be coupled to enable/disable a current source 704 to provide a current of I'x2, etc. In one example, a logic high value (1) for any of the storage bits $BIT_{1-N}$ would correspond to a closed (or in other words, enabled) switch 704. In another example, a logic low value (0) for any of the storage bits $BIT_{1-N}$ may correspond to a closed (or in other words, enabled) switch 704. The currents provided by each current source 704 when enabled are summed together to provide a voltage drop (e.g., $V_{INPK}$) across resistor 706.

Figure 8:
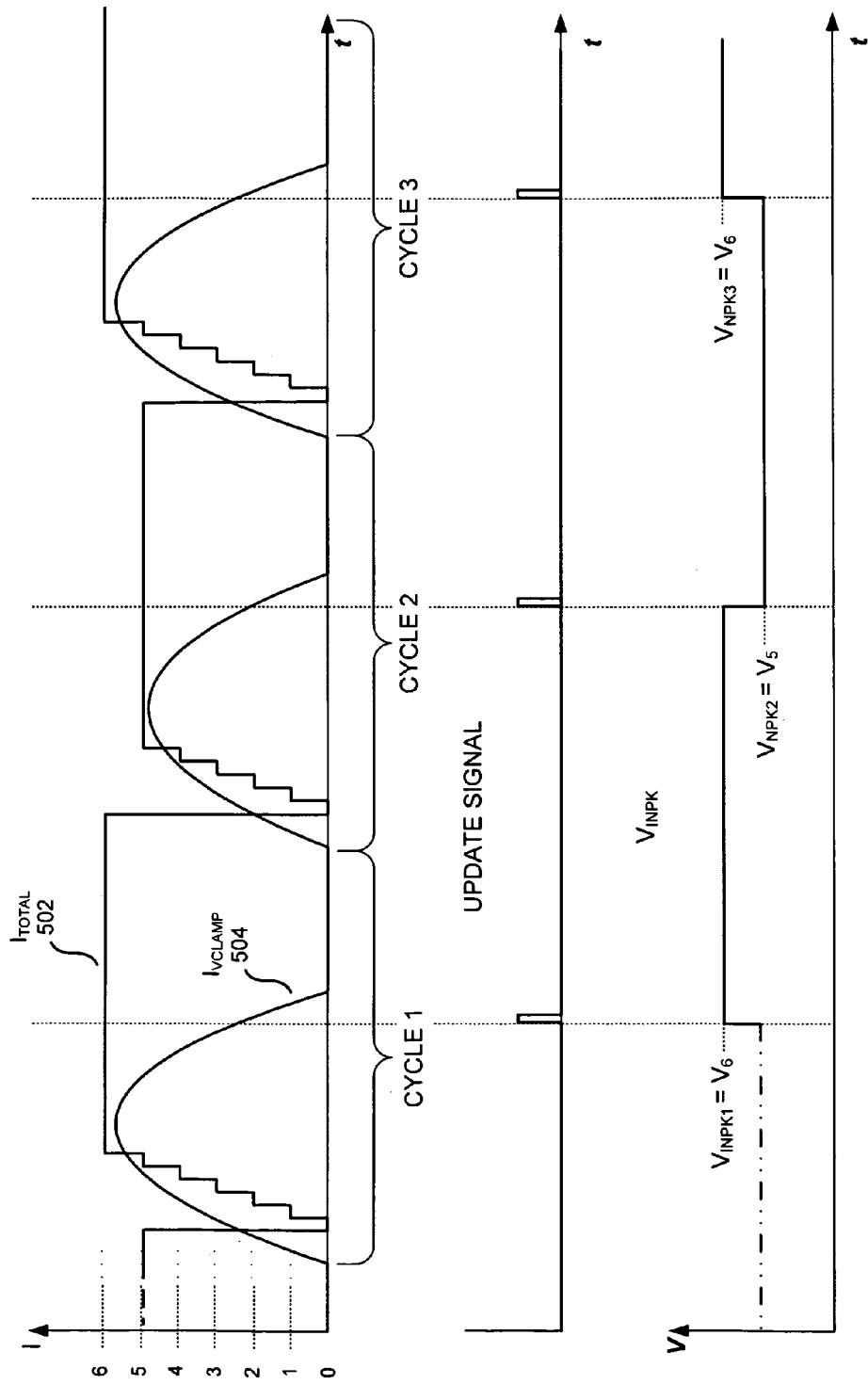
FIG. 8 shows example waveforms at the input of the comparator of FIG. 3, of the update and reset circuit of FIG. 2, and of the D/A converter of FIG. 7.

FIG. 8 shows example waveforms at the input of comparator 308 of FIG. 3, at the update input of D/A converter 700, and of the analog input voltage peak signal $V_{INPK}$. The waveforms of FIG. 8 are described with reference to FIGS. 3, 7 and 8. Waveform 502 is one possible representation of the total current signal $I_{TOTAL}$ received at input IN1 of comparator 308. Waveform 504 is one possible representation of the current signal $I_{VCLAMP}$ received at input IN2 of comparator 308. As shown in FIG. 8, waveform 504 is representative of a rectified and clamped AC input voltage signal. Waveform 504 is further shown as including a plurality of cycles (e.g., cycle 1, 2 and 3). As is shown in FIG. 8, the count stored in internal storage 702 of D/A converter 700 is updated in response to the UPDATE signal. More specifically the UPDATE signal may be asserted in response to the input voltage reaching a threshold input voltage value. For example, since input voltage $V_{IN}$ is periodic, a certain input voltage threshold value may assert UPDATE signal such that $D_{COUNT}$ can be updated into storage 702 during each cycle. In another example, UPDATE signal may be timed, such that the UPDATE signal will update storage with $D_{COUNT}$ periodically to represent to peak input voltage of each input voltage cycle. In another example, UPDATE signal may be in response to a duty factor threshold. For example, when the duty cycle (calculated by switching block 206) reaches a certain threshold, UPDATE signal may be asserted. The UPDATE signal is configured to be output to D/A converter 700 at least once during each cycle of the rectified input voltage $V_{IN}$ and will be asserted after the peak of that particular input voltage cycle. In one example, the RESET signal and UPDATE signal may be implemented using a single pulsed signal. For example, update and reset circuit 210 may generate a pulsed signal where a rising edge of the pulse is the UPDATE signal and where a falling edge of the pulse is the RESET signal. As shown, $V_{INPK}$ will represent a peak input voltage for a particular input voltage cycle until the next UPDATE signal is asserted. Therefore, peak input voltage $V_{INPK}$ may lag the current peak input voltage. In addition, peak input voltage $V_{INPK}$ may represent a prior peak input voltage while digital peak detector 300 in the process of determining the next peak input voltage. As shown IN FIG. 8, peak input voltage $V_{INPK}$ lags the current peak voltage.

Figure 9:
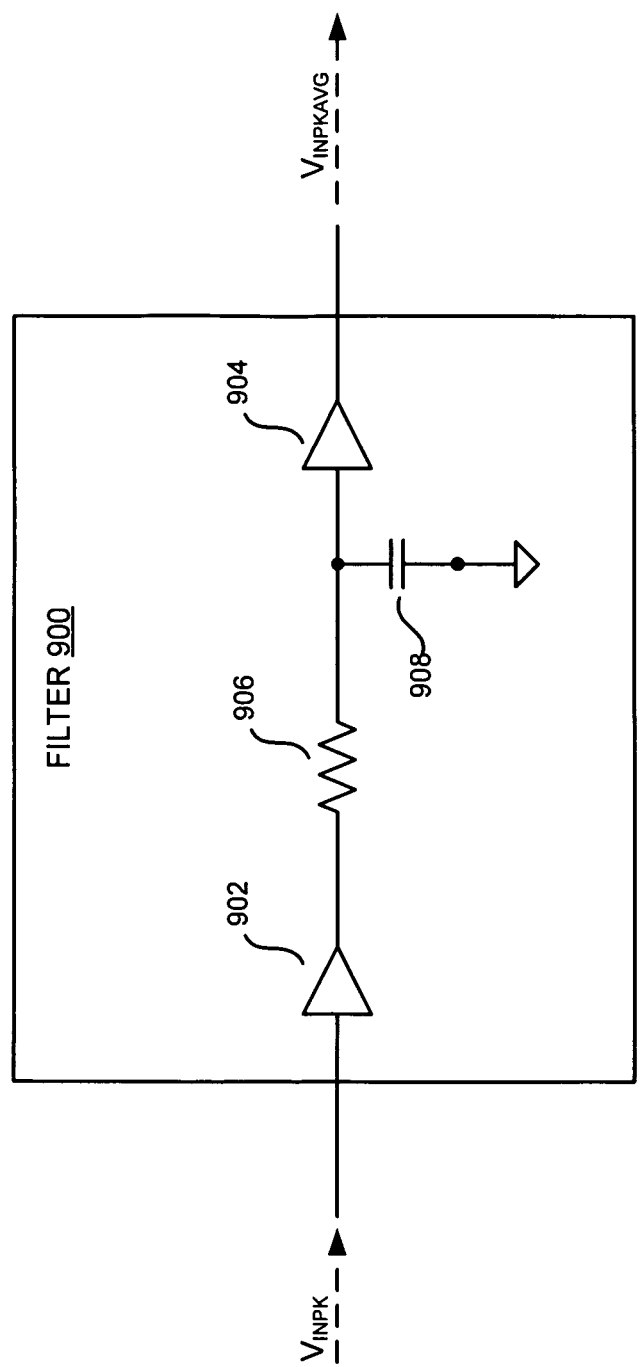
FIG. 9 is a functional block diagram illustrating an example filter circuit which may be utilized in the controller of FIG. 3.

FIG. 9 is a functional block diagram illustrating an example filter circuit 900, in accordance with the teachings of the present invention. The illustrated example of filter circuit 900 includes buffers 902 and 904, resistor 906, and an averaging capacitor 908. Filter circuit 900 is one possible implementation of filter circuit 212 of FIG. 2.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An integrated circuit controller for a power converter, the controller comprising:
    a digital peak detector to be coupled to receive a rectified voltage signal that is representative of a time-varying input voltage of the power converter that has a peak value each input voltage cycle of the power converter, wherein the digital peak detector is coupled to generate a digital count signal representative of the peak value of the time-varying input voltage, and coupled to output a digital count signal representative of a peak input voltage of the power converter, wherein the digital peak detector comprises:

a counter coupled to increment a count of the counter in response to a clock signal and to output the digital count signal, wherein the digital count signal is representative of the count, and wherein the counter is coupled to be reset each input voltage cycle of the power converter;

a plurality of current sources coupled to the counter to output a total current signal having a value responsive to the count of the counter; and a comparator coupled to compare the total current signal and a current signal representative of the time-varying input voltage of the power converter, wherein the counter is further coupled to stop counting when total current signal is greater than the current signal representative of the input voltage; and a switching block coupled to control switching of a power switch of the power converter to regulate an output of the power converter, wherein the switching block is coupled to control the switching of the power switch in response to the digital count signal.

2. The integrated circuit controller of claim 1, further comprising a hysteresis circuit coupled to adjust the total current signal if the count of the counter is equal to a previous count of the counter.

3. The integrated circuit controller of claim 1, further comprising a digital-to-analog (D/A) converter coupled to the digital peak detector to store the digital count signal and to output an analog input voltage peak signal in response to the digital count signal.

4. The integrated circuit controller of claim 3, wherein the input voltage of the power converter includes a plurality of cycles, wherein the D/A converter is configured to store the digital count signal at least until a next cycle of the input voltage.

5. The integrated circuit controller of claim 3, wherein the D/A converter further comprises a plurality of current sources coupled to output the analog input voltage peak signal, wherein the analog input voltage peak signal has a value responsive to the digital count signal.

6. The integrated circuit controller of claim 3, further comprising a filter coupled to the D/A converter to output an average analog input voltage peak signal.

7. The integrated circuit controller of claim 6, wherein the switching block is configured to adjust a power factor of the power converter in response to the average analog input voltage peak signal.

8. An integrated circuit controller for a power converter, the controller comprising:

a digital peak detector to be coupled to receive a rectified voltage signal that is representative of a time-varying input voltage of the power converter that has a peak value each input voltage cycle of the power converter, wherein the digital peak detector is coupled to generate a digital count signal representative of the peak value of the time-varying input voltage, and coupled to output a digital count signal representative of a peak input voltage of the power converter, wherein the digital peak detector comprises:

a counter coupled to increment a count of the counter in response to a clock signal and to output the digital count signal, wherein the digital count signal is representative of the count, and wherein the counter is coupled to be reset each input voltage cycle of the power converter;

a plurality of current sources coupled to the counter to output a total current signal having a value responsive to the count of the counter; and a comparator coupled to compare the total current signal and an current signal representative of the time-varying input voltage of the power converter, wherein the counter is further coupled to stop counting when total current signal is greater than the current signal representative of the input voltage; and a digital-to-analog (D/A) converter coupled to the digital peak detector to store the digital count signal and to output an analog input voltage peak signal in response to the digital count signal.

9. The integrated circuit controller of claim 8, wherein the input voltage of the power converter includes a plurality of cycles, wherein the D/A converter is configured to store the digital count signal at least until a next cycle of the input voltage.

10. The integrated circuit controller of claim 9, wherein the D/A converter further comprises a plurality of current sources coupled to output the analog input voltage peak signal, wherein the analog input voltage peak signal has a value responsive to the digital count signal.

11. The integrated circuit controller of claim 1, further comprising a reset circuit coupled to generate a reset signal to reset the counter each input voltage cycle of the power converter.

12. The integrated circuit controller of claim 11, wherein the reset circuit is coupled to generate the reset signal to reset the counter in response to the input voltage reaching a threshold input voltage value.

13. The integrated circuit controller of claim 11, wherein the reset signal is timed, such that the reset circuit generates the reset signal to reset the counter each input voltage cycle of the power converter.

14. The integrated circuit controller of claim 11, wherein the reset circuit is coupled to generate the reset signal to reset the counter in response to a duty factor threshold of the integrated circuit controller.

15. The integrated circuit controller of claim 8, further comprising a reset circuit coupled to generate a reset signal to reset the counter each input voltage cycle of the power converter.

16. The integrated circuit controller of claim 15, wherein the reset circuit is coupled to generate the reset signal to reset the counter in response to the input voltage reaching a threshold input voltage value.

17. The integrated circuit controller of claim 15, wherein the reset signal is timed, such that the reset circuit generates the reset signal to reset the counter each input voltage cycle of the power converter.

18. The integrated circuit controller of claim 15, wherein the reset circuit is coupled to generate the reset signal to reset the counter in response to a duty factor threshold of the integrated circuit controller.

* * * * *